(12) United States Patent
Arndt et al.

(10) Patent No.: US 6,848,819 B1
(45) Date of Patent: Feb. 1, 2005

(54) LIGHT-EMITTING DIODE ARRANGEMENT

(75) Inventors: KarlHeinz Arndt, Regensburg (DE);
Guenter Waitl, Regensburg (DE);
Georg Bogner, Lappersdorf (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/009,656

(22) PCT Filed: May 12, 2000

(86) PCT No.: PCT/DE00/01508
§ 371 (c)(1),
(2), (4) Date: Mar. 26, 2002

(87) PCT Pub. No.: WO00/69000
PCT Pub. Date: Nov. 16, 2000

(30) Foreign Application Priority Data

May 12, 1999 (DE) ......................... 199 22 176

(51) Int. Cl.[7] ............................. F21S 8/10; F21V 21/00
(52) U.S. Cl. ....................... 362/545; 362/547; 362/487; 362/498; 362/373; 362/800
(58) Field of Search ................................ 362/545, 543, 362/544, 547, 487, 498, 373, 800, 473; 361/707, 708; 174/252

(56) References Cited

U.S. PATENT DOCUMENTS

| | | | | |
|---|---|---|---|---|
| 5,059,778 A | * | 10/1991 | Zouzoulas et al. | 235/472 |
| 5,404,282 A | | 4/1995 | Klinke et al. | |
| 5,519,596 A | | 5/1996 | Woolverton | |
| 5,528,474 A | * | 6/1996 | Roney et al. | 362/249 |
| 5,782,555 A | | 7/1998 | Hochstein | |
| 5,785,418 A | * | 7/1998 | Hochstein | 362/373 |
| 5,806,965 A | * | 9/1998 | Deese | 362/249 |
| 5,857,767 A | * | 1/1999 | Hochstein | 362/294 |
| 5,890,794 A | * | 4/1999 | Abtahi et al. | 362/294 |
| 6,045,240 A | * | 4/2000 | Hochstein | 362/294 |
| 6,175,084 B1 | * | 1/2001 | Saitoh et al. | 174/252 |
| 6,480,389 B1 | * | 11/2002 | Shie et al. | 361/707 |
| 6,490,159 B1 | * | 12/2002 | Goenka et al. | 361/700 |
| 6,501,662 B2 | * | 12/2002 | Ikeda | 361/760 |
| 6,520,669 B1 | * | 2/2003 | Chen et al. | 362/545 |
| 6,682,211 B2 | * | 1/2004 | English et al. | 362/545 |
| 2003/0021121 A1 | * | 1/2003 | Pederson | 362/493 |

FOREIGN PATENT DOCUMENTS

| | | |
|---|---|---|
| DE | 42 38 417 A1 | 5/1993 |
| DE | 296 03 557 U1 | 5/1996 |
| DE | 195 28 459 A1 | 2/1997 |
| EP | 0 253 244 | 1/1998 |
| GB | 2 261 549 | 5/1993 |

OTHER PUBLICATIONS

Abstract of EP 253244.
Abstract of DE 19528459.
Abstract of Matthias Martin, Light Emitting Diodes, Weltlichtschau 4/99, p. 278–281.
Moellmer, Frank & Waitl, Guenter, Siemens–SMT–TOP–LED–LEDs for Surface Mounting: Siemens Components XXVI (1991) No. 4–5.pp. 147–149.

* cited by examiner

Primary Examiner—Stephen Husar
Assistant Examiner—Sharon Payne
(74) Attorney, Agent, or Firm—Schiff Hardin LLP

(57) ABSTRACT

An LED array surface-mounted on a circuit board and applied to a cooling member, such that any generated heat is optimally eliminated. The cooling member can be in any desired shape so that motor vehicle lights, such as blinkers, can be adapted to the outside contour of the vehicle. For a rotating light, the circuit board can be applied around a cooling member fashioned as a hollow cylindrical member which is adapted to rotate.

18 Claims, 3 Drawing Sheets

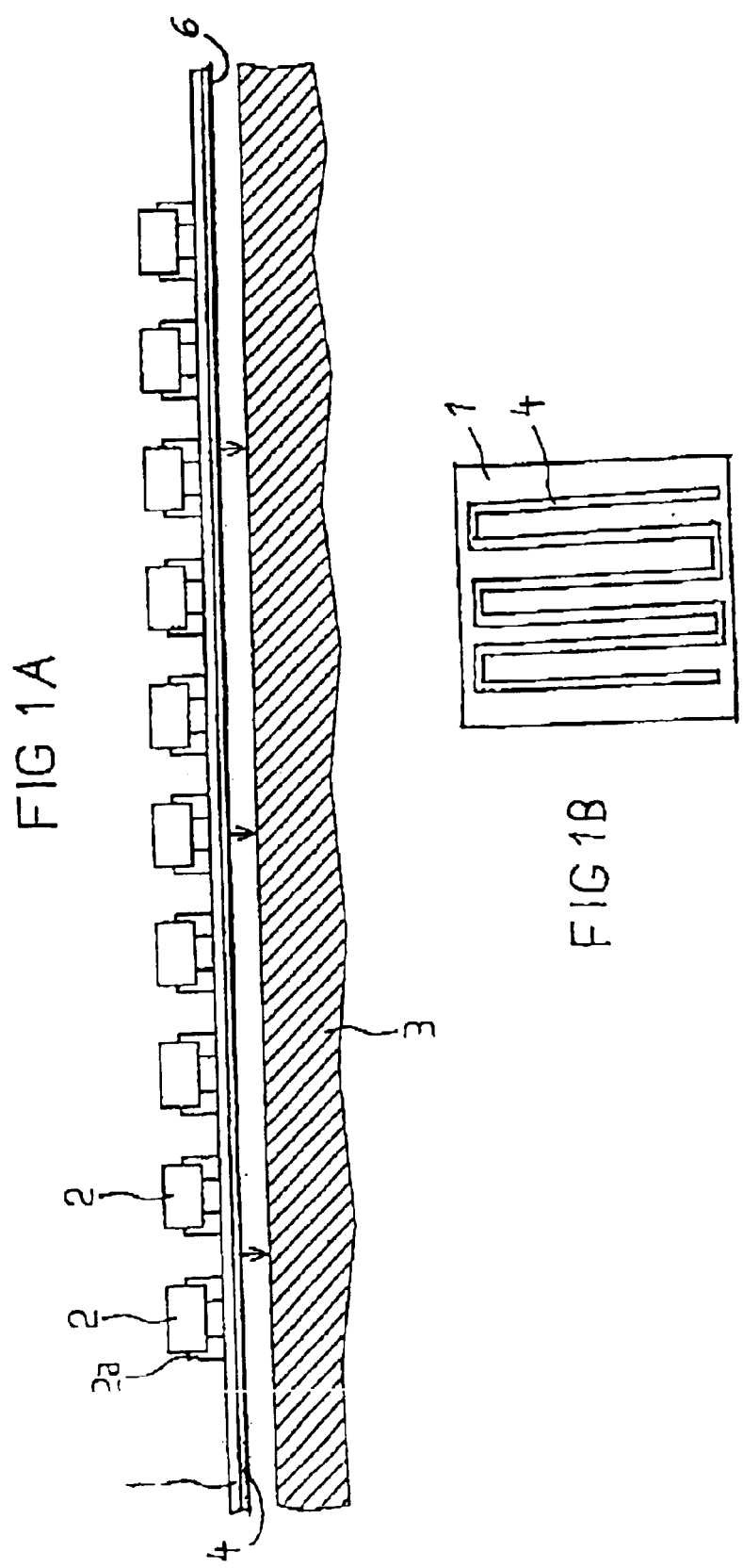

LIGHT-EMITTING DIODE ARRANGEMENT

BACKGROUND OF THE INVENTION

1. Field of the Invention

The present invention is directed to LED (light emitting diode) arrangements. In particular, the present invention is directed to LED arrangements that can be built into a lamp housing or located in exterior lights of motor vehicles.

2. Brief Discussion of the Related Art

In the field of exterior and interior illumination of motor vehicles, light-emitting diodes (LEDs) are being increasingly used instead of conventional incandescent bulbs, particularly for tail lights and brake lights, since LEDs have a longer service life, a better efficiency in the conversion of electrical energy into radiation energy in the visible spectral range and, connected therewith, a lower heat emission and a lower space requirement overall.

EP 0 253 224 discloses a method for the manufacture of a light with light-emitting diodes. The light to be manufactured comprises a soft plastic film on whose upper side a copper lamination is applied and a plurality of light-emitting diodes are arranged. The plastic film has its side lying opposite the upper side glued onto a metallic carrier plate. The light is provided for employment in a motor vehicle, whereby the carrier plate can be implemented bent for adaptation to the shape of a motor vehicle.

Further, U.S. Pat. No. 5,782,555 discloses a traffic signal light that comprises a plurality of LEDs as luminous members. The LEDs are secured on the surface of a printed circuit board that is provided with a both-sided metallization. A plurality of through holes via which the metallizations are connected to one another are formed in the printed circuit board. The printed circuit board is secured with an adhesive to a cooling member that is provided with an electrically insulating surface.

U.S. Pat. No. 5,890,794 discloses another lighting unit on the basis of LEDs. Here, a plurality of radial LEDs is mounted on a printed circuit board, whereby the wire leads are conducted through the printed circuit board in a traditional way. In one illustrated embodiment, the printed circuit board is flexible and applied onto a cylindrical member. A coolant fluid is preferably employed for cooling.

A certain added outlay must be incurred first when constructing a light with LEDs since, due to the low luminance of an individual LED compared to an incandescent bulb, a plurality of LEDs shaped to form an array must be constructed.

For example, such an array can be mounted using surface mounting technology (SMT) with a plurality of LEDs on a printed circuit board (PCB). Such an LED structure is described in the article "SIEMENS SMT-TOPLED für die Oberflächenmontage" by F. Möllmer and G. Waitl in the periodical Siemens Components 29 (1991), Number 4, page 147. The form of the LEDs is extremely compact and allows the arrangement of a plurality of such LEDs in a row or matrix arrangement as warranted.

However, only approximately 5% of the electrical power is converted into light within the housing of such an LED that, for example, emits yellow-colored or amber-colored light, whereas approximately 95% is converted into heat. This heat is eliminated from the underside of the chip via the electrical terminal of the component. Dependent on the structure, the heat given the components known as TOPLED® or Power TOPLED® is first conducted out of the housing onto the solder points on the printed circuit board by one or three existing cathode terminals. From the solder points, the heat at first propagates in the copper pads and then on the epoxy resin material in the plane of the printed circuit board. Subsequently, the heat is output large-area to the environment by thermal radiation and thermal convection. The thermal resistance is still relatively slight in the case of a single LED on FR4 circuit board material (for example, approximately 180 K/W given an LED of the type Power TOPLED®).

The situation is different however, when many LEDs are arranged in close proximity on a circuit board. A smaller percentual area of the PCB is now available for each individual LED for heat transmission to the environment. The thermal resistance from the PCB onto the environment is correspondingly higher. For instance, given a components spacing of 6.5 mm, the thermal resistance rises to up to 550 K/W when the LEDs are of the Power TOPLED® type, and the printed circuit board is of the type FR4.

Heat is emitted from all heat-generating components on the circuit board, i.e. from the dropping resistors, transistors, MOSFETs, or drive ICs that are located in the immediate proximity of the LEDs. Operating current must be reduced so that destruction of the component does not occur as a consequence of heat generation on the circuit board and inadequate heat elimination. Thus, the luminous power of the LEDs cannot be fully exploited.

LED arrangements are utilized for the third brake light in the aforementioned field of motor vehicle lighting. This is a single-line array wherein the thermal problems are not yet so critical.

SUMMARY OF THE INVENTION

It is therefore an object of the present invention to improve an LED arrangement such that the luminous power of the LEDs can be as optimally utilized. In particular, an object of the present invention is to specify a surface-mounted LED arrangement that is distinguished by an improved heat elimination from the LEDs. In addition, an LED arrangement should be made available with which different spatial shapes of three-dimensional lamps can be realized in a simple way.

According to the invention, an LED arrangement with a printed circuit board and a plurality of LEDs—surface-mounted LEDs are especially preferred—is provided, whereby the printed circuit board has its side facing away from the LEDs applied on a cooling member and comprises a metallic layer with good thermal conductivity on this side that is electrically insulated from the LEDs by the printed circuit board. The present invention is thus based on the perception that heat elimination toward the back must be promoted, particularly given a surface-mounted LED arrangement having a high LED density.

The cooling member can be composed of copper or aluminum or of a cooling plate, and the printed circuit board is preferably secured to it with a thermally conductive paste, a thermally conductive adhesive, a thermally conductive film or the like. It should enable an optimally good heat dissipation at its back side. To this end, for example, it can be painted black and/or comprise cooling ribs and/or a rough surface.

Further, the printed circuit board should be as thin as possible since the plastic material of which it is constructed usually conducts heat poorly. For example, the printed circuit board can be a flexible printed circuit board. The flexible printed circuit board is generally manufactured of a flexible plastic. For example, it can be composed of polyester or polyamide film, or it may comprise what is often referred to as flex-board. Flex board is generally multi-layer printed circuit boards that are uniformly constructed of a plurality of polyamide carrier films.

Further, the copper pads around the solder surfaces of LEDs applied with surface mounting technique (SMT) should be as large as possible in order to broaden the heat path through the printed circuit board material before the heat flows to the back side of the printed circuit board. Preferably, the principal face of the printed circuit board facing toward the cooling member is laminated with copper or some other metal in order to enable thermal conduction transversely to other glue locations given cavities in the lamination. For example, the copper layer can be structured meander-shaped laterally to the printed circuit board in order to preserve the flexibility of the printed circuit board.

In an embodiment of the LED arrangement according to the present invention, a cooling member having a specific three-dimensional shape is employed, and a flexible printed circuit board having a principal face provided with a plurality of LEDs is laminated onto the surface of the cooling member shaped or curved in this way. As a result thereof, LED modules spatially shaped on the basis of specific particulars can be manufactured. For example, an LED module such as a blinker, tail light, brake light, or the like, can be adapted to the outside contour of the vehicle in a space-saving fashion. An especially practical exemplary embodiment of this type is a rotating light wherein LED arrays on flex boards are laminated around a cylindrical cooling member.

The LED arrangement of the present invention can preferably have its printed circuit board applied on a highly thermally conductive partial surface region of a device housing or of an automobile chassis or the like. Advantageously, the device housing or the automobile chassis thereby acts as cooling member. Among other things, this leads to a lower technological manufacturing outlay and to a weight-saving. Thus, the thermally conductive partial surface region serves as the cooling member in the present invention.

BRIEF DESCRIPTION OF THE DRAWINGS

FIG. 1A shows a side view of an embodiment of the present invention;

FIG. 1B shows a schematic of an embodiment of a thermally conductive layer according to the present invention.

DETAILED DESCRIPTION OF THE PRESENTLY PREFERRED EMBODIMENTS

Figure 2A:
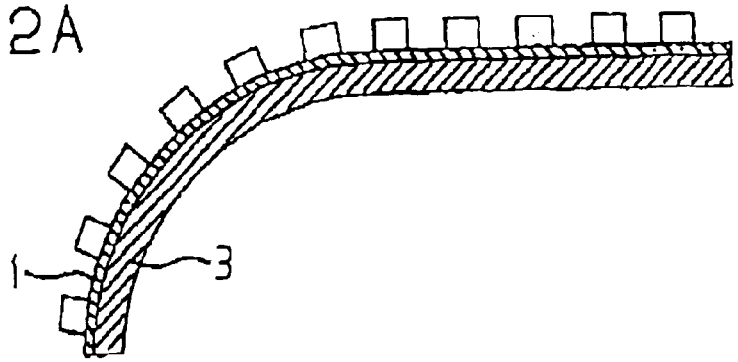
FIGS. 2A–2D show other embodiments of the present invention with different shapes of cooling members.

The embodiment of the present invention shown in FIG. 1A contains a printed circuit board 1 on which a plurality of preferably surface-mounted LEDs 2 are applied. In a known way, the printed circuit board 1 thereby forms a circuit that comprises terminal surfaces for the mounting of the LEDs at defined locations. These terminal surfaces are provided, for example, with lands for soldering in an automatic surface mount device (SMD) equipping unit, and the LEDs 2 have their electrical contacts 2a soldered to these terminal surfaces in a subsequent mounting step.

The printed circuit board 1 can be a rigid printed circuit board, such as type FR4, and constructed of an epoxy resin material. However, it can also be a flexible printed circuit board such as an above-described flex board. The printed circuit board 1 is laminated onto a cooling member 3 with a thermally conductive adhesive 6, a thermally conductive paste 6 or a thermally conductive film 6, said cooling member 3 being composed of a cooling plate or being fabricated of some other metal such as copper or aluminum, and thus exhibiting a high thermal conductivity.

The principal face of the printed circuit board 1 facing toward the cooling member is laminated with a layer 4 having good thermal conductivity, such as with a copper layer or some other metal layer in order to enable thermal conduction transversely to other glue locations given cavities in the lamination. The copper layer can be meander-shaped as shown in FIG. 1B in order to preserve the flexibility of the printed circuit board.

The side of the cooling member 3 facing away from the printed circuit board 1 is preferably designed such that heat output to the environment is maximized. To this end, this surface is blackened and/or provided with cooling ribs and/or implemented with some other suitable surface structure or roughening.

Figure 2B:
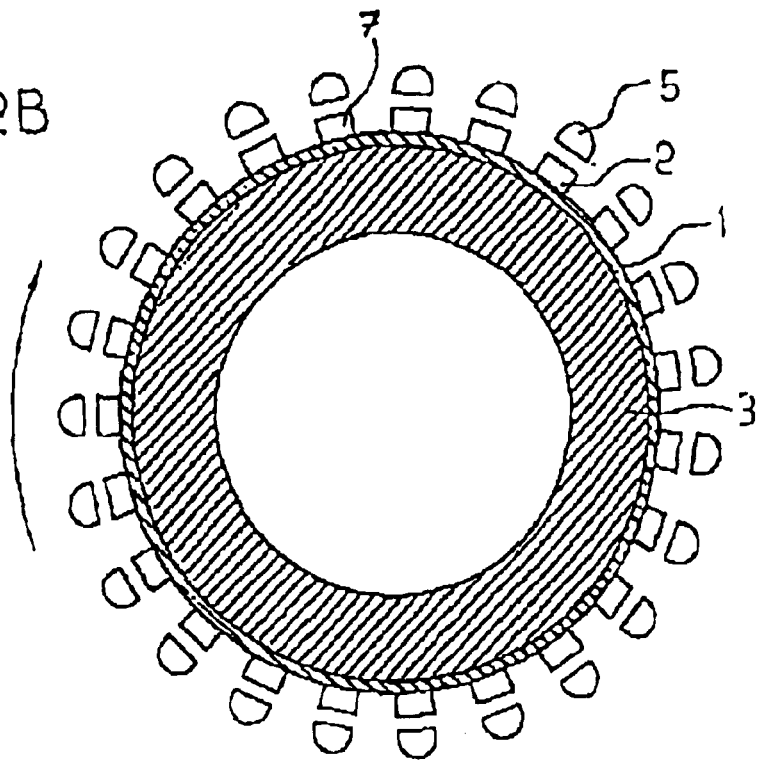
Figure 2C:
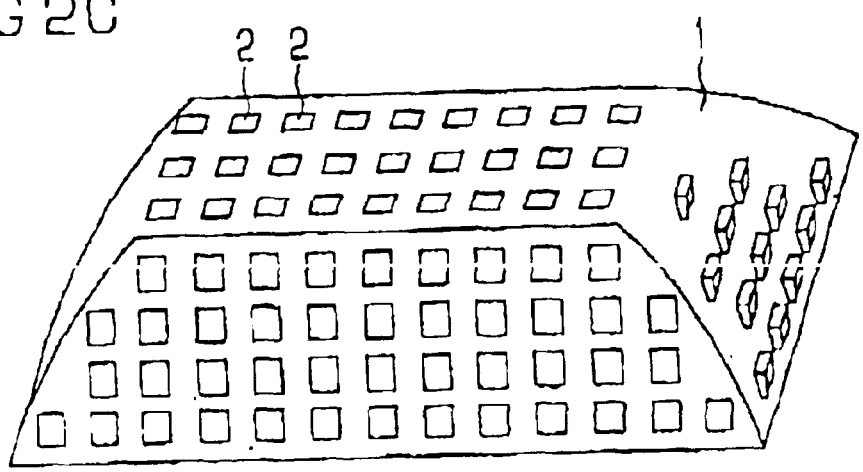

FIGS. 2A through C show how the invention can be advantageously utilized in order to manufacture specific three-dimensional lighting members. In all illustrated instances, a cooling member 3 having a desired shape is first prepared, whereby one surface should be fashioned as luminous surface by applying an LED arrangement composed of surface-mounted LEDs 2. A flexible printed circuit board 1 such as a flex board that is provided with an array of LEDs 2 is then laminated onto the cooling member 3.

In a side view, FIG. 2A shows an arbitrary curvature of a cooling member 3 that can be especially advantageously employed for an exterior vehicle illumination such as a blinker, a tail light, a brake light, or the like, since it can be adapted to the outside contour of the vehicle in a space-saving fashion. The cooling member can be directly formed by a partial surface region of an automobile chassis, such as the headlight or tail light region of the fenders, or a device housing.

The exemplary embodiment of FIG. 2B shows an axial cross-section through a rotating light of a type that can, be employed in emergency vehicles, for example. For the rotating light of FIG. 2B, the flex board 1 is provided with an array of LEDs 2 is laminated around a tubularly shaped, cylindrical, hollow cooling member 3. In this exemplary embodiment, the LEDs of the array proceeding parallel to the axis can be additionally combined to form lanes that are successively driven in a clockwise direction, so that a rotating light is produced. The lanes extend in the direction perpendicular to the plane of protection of FIG. 2B from each shown diode. At one point in time, one lane or a specific plurality of neighboring lanes can thereby be driven simultaneously. For bundling the emitted light, the LEDs 2 can be provided with lenses 5. This embodiment has the advantage that practically all mechanical parts that have hitherto been needed for rotating lights of a conventional type are eliminated. As desired, the cylindrical cooling member 3 can also have a gas, such as air or a liquid coolant, flowing through it for further improvement of the heat elimination.

Figure 2D:
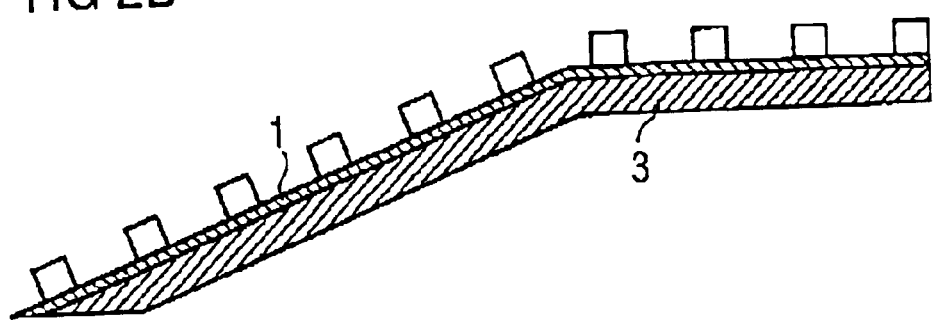

FIG. 2C shows a perspective view of a three-dimensionally arced light dome. The light dome comprises a regular shape with an upper surface and four obliquely placed side surfaces, two respective side surfaces thereof are arranged axially symmetrically relative to one another. The cooling member itself cannot be seen in the illustration of FIG. 2C since it is completely covered by the flex board. The flex board 1 comprises a plurality of sectors corresponding to the surfaces of the cooling member and wherein a plurality of LEDs 2 arranged in an array are respectively mounted. The LEDs 2 can be provided with lenses for bundling the emitted light, as desired. Such a light dome can be utilized for all types of lighting purposes. FIG. 2D shows a singly angled surface similar to the arbitrary curved surfaces in FIG. 2A.

Although modifications and changes may be suggested by those skilled in the art to which this invention pertains, it is the intention of the inventors to embody within the patent warranted hereon all changes and modifications that may reasonably and properly come under the scope of their contribution to the art.

What is claimed is:

1. A surface-mounted LED arrangement, comprising:
   a printed circuit board having a principal surface and a secondary surface, said printed circuit board comprising a plastic material,
   a plurality of LEDs arranged on said principal surface,
   a metallic layer provided on said secondary surface that is electrically insulated from said plurality of LEDs,
   a cooling member connected to said secondary surface, wherein said printed circuit board is secured to said cooling member with at least one of a thermally conductive paste, a thermally conductive adhesive and a thermally conductive film, and
   wherein said secondary surface is applied to a target surface that is at least one of a curved surface, a singly angled surface comprising at least two planes that are not co-planar, and a multiply angled surface of: a) said cooling member, b) a thermally conductive partial region of a device housing, or c) an automobile chassis, such that said plurality of LEDs are arranged in a spatial form determined by said target surface.

2. The LED arrangement according to claim 1, wherein said metallic layer comprises copper or other metal having good thermal conductivity.

3. The LED arrangement according to claim 2, wherein said printed circuit board comprises a flexible printed circuit board structure.

4. The LED arrangement according to claim 1, wherein said metallic layer comprises a meander-like lateral structure.

5. The LED arrangement according to claim 1, wherein said cooling member comprises a metal.

6. The LED arrangement according to claim 1, wherein a surface of said cooling member remotely positioned from said printed circuit board is blackened, comprises cooling ribs or is provided with a roughened surface.

7. The LED arrangement according to claim 1, wherein said plurality of LEDs are provided with lenses.

8. The LED arrangement according to claim 1, wherein said printed circuit board comprises one of an epoxy resin, a polyester or a polyamide.

9. A lighting device comprising the LED arrangement according to claim, 1.

10. The lighting device according to claim 9, wherein said lighting device is an exterior lighting fixture of a motor vehicle, and said cooling member comprises a curvature adapted to one of an outside contour of said motor vehicle or to a partial surface region of an automobile chassis.

11. The lighting device according to claim 10, wherein said LED arrangement is a rotating light, and said cooling member has a cylindrical hollow shape with said printed circuit board applied to an outside wall thereof.

12. The lighting device according to claim 11, said plurality of LEDs that proceed axially are electrically combined into lanes that can be successively circumferentially operated.

13. The lighting device according to claim 11, wherein said lighting device is an exterior lighting fixture of a motor vehicle, and said cooling member comprises a curvature adapted to one of an outside contour of a motor vehicle or to a partial surface region of an automobile chassis.

14. The lighting device according to claim 11, wherein said LED arrangement is a rotating light, and said cooling member has a cylindrical hollow shape with said printed circuit board applied to an outside wall thereof.

15. The lighting device according to claim 14, wherein said plurality of LEDs that proceed axially parallel are electrically combined into lanes that can be successively circumferentially operated.

16. The LED arrangement according to claim 3, wherein the flexible printed circuit board is a flex board.

17. The LED arrangement according to claim 5, wherein said metal is selected from the group consisting of copper, aluminum, and sheet metal.

18. The LED arrangement according to claim 8, wherein said epoxy resin, polyester or polyamide is in the form of a polyester or polyamide film.

* * * * *